United States Patent [19]
Curry et al.

[11] Patent Number: 5,914,609
[45] Date of Patent: Jun. 22, 1999

[54] METHOD AND SYSTEM FOR BATTERY CHARGING AND TESTING WITH SEMI-AUTOMATIC CALIBRATION

[75] Inventors: Thomas E. Curry, Hazelwood, Mo.; Richard G. Casebolt, Highland, Ill.; Richard A. Freeman, St. Louis, Mo.

[73] Assignee: Bitrode Corporation, Fenton, Mo.

[21] Appl. No.: 08/745,752

[22] Filed: Nov. 8, 1996

[51] Int. Cl.⁶ .................................................. G01R 31/02
[52] U.S. Cl. ........................................................... 324/601
[58] Field of Search ..................................... 324/601, 427, 324/426, 433; 702/104; 73/1 R; 320/162, 165, 161

[56] References Cited

U.S. PATENT DOCUMENTS

| | | | |
|---|---|---|---|
| 5,047,961 | 9/1991 | Simonsen | 320/165 |
| 5,049,804 | 9/1991 | Hutchings | 320/165 |
| 5,321,638 | 6/1994 | Witney | 702/104 |
| 5,539,305 | 7/1996 | Botka . | |
| 5,710,503 | 1/1998 | Sideris | 324/426 |
| 5,764,034 | 6/1998 | Bowman | 324/427 |

*Primary Examiner*—Maura Regan
*Attorney, Agent, or Firm*—Polster, Lieder, Woodruff & Lucchesi, LLC

[57] ABSTRACT

A method and system is provided for calibrating a plurality of electrical circuits used to charge and test a plurality of battery cells. An improved cell rack module includes at least one movable platen having a plurality of pin assemblies removably secured thereto. The movable platen is slidably movable within the cell rack module between an extended position or a retracted position. Extension mechanisms are used to force the movable platen into the extended position during calibration, charging and testing procedures, and retraction mechanisms return the platen to the retracted position when the extension mechanisms are not actuated. When the movable platen is in the extended position, the pin assemblies are maintained in electrical contact with either the battery cells associated with a conventional cell tray or contact plates associated with a calibration tray. In this situation, the pin assemblies allow for current and voltage signal transmission between charging and testing circuitry and the battery cells or contact plates. Each pin assembly can be quickly and easily disconnected from the movable platen and replaced if it becomes damaged or worn out. Each calibration tray includes control circuitry that is electrically connected to the charging and testing circuitry via certain pin assemblies. The control circuitry allows for selective application of one or more known calibration standards across the contact plates during the calibration procedures.

12 Claims, 7 Drawing Sheets

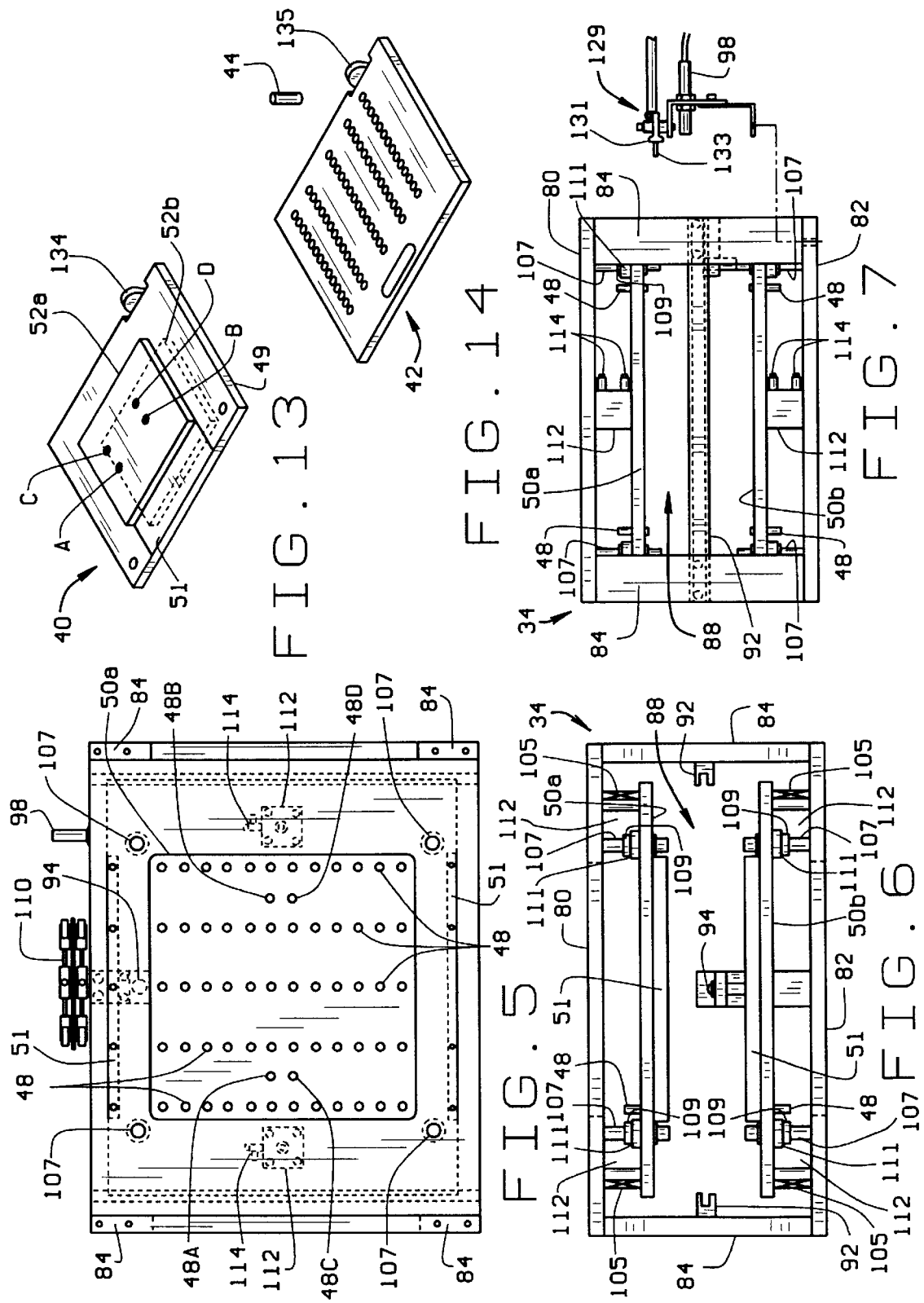

METHOD AND SYSTEM FOR BATTERY CHARGING AND TESTING WITH SEMI-AUTOMATIC CALIBRATION

CROSS-REFERENCE TO RELATED APPLICATIONS

Not Applicable.

STATEMENT REGARDING FEDERALLY SPONSORED RESEARCH OR DEVELOPMENT

Not Applicable.

BACKGROUND OF THE INVENTION

This invention relates to rechargeable batteries and small cell formation, and in particular to a method and system for charging and testing batteries that includes a semi-automatic calibration system operably connected thereto. The calibration system calibrates the charging and test system to provide increased reliability and accuracy during subsequent testing, measurement and control of battery current and voltage. The charging and test system is capable of simultaneous charging and testing of a plurality of battery cell assemblies. The charging and test system connects to the individual cells through a plurality of charging and data acquisition channels connected to a plurality of coaxial pin assemblies that have separated inner and outer conductors. These pins utilize a spring clip connector that performs the functions of mechanical retention and electrical connection. The spring clip connectors can be quickly and easily disconnected so that each individual pin assembly can be easily replaced when worn out or damaged. One embodiment of the present invention includes a calibration tray that is operably connected to the charging and testing system in place of a cell tray that holds the battery cells during charging and testing operations.

Rechargeable or galvanic batteries generally include an assembly of one or more electrochemical cells that convert energy produced by chemical reactions within the cells into low voltage, direct current electric energy. Each cell contains a cathode (positive electrode), an anode (negative electrode) and an electrolyte. When the cells are initially manufactured by placing the cathode, anode and electrolyte inside the cell case, charging equipment is used to apply a precisely controlled unidirectional current through the cell, from the cathode to the anode. This current produces an electrochemical reaction that converts the cathode, anode and electrolyte into chemical compounds that store energy for future use. This process may involve a plurality of time-varying current levels, including levels of zero current and/or current flow in the opposite direction (discharge). As is known to those skilled in the art, this process is referred to as formation.

After the cells undergo the formation process, the cells can be used to receive, store, generate and deliver electrical energy. As current is drawn from the battery, each cell is discharged. After discharge of a secondary battery, the original chemical state may be regained by recharging the cells. To reform the chemical reactants within the cell, a unidirectional charge current is applied to the electrodes of the battery in the opposite direction to that during discharge.

When manufacturing batteries utilizing cells of small size, such as those used in portable computing, telecommunication and electronic equipment, it is desirable to have a system to perform the formation process that can simultaneously process a large number of cells, maintain accurate control of the formation process of each cell at all times, and minimize the labor needed to load, connect, process, disconnect and unload these cells to and from the charging and testing equipment.

Normal manufacturing tolerances present in cell formation dictate that the charging and testing system must be capable of controlling the charging and testing processes for each cell on an individual basis, or a relatively small group of cells with respect to the total number of cells being processed at a given time. Therefore, it is desirable to develop a charging and test system that supports a plurality of data acquisition and control channels, with each channel being dedicated to one cell, or a relatively small group of cells.

It is further desirable to develop a method and system for battery charging and testing with semi-automatic calibration that is easily maintainable. In particular, the area that requires the most maintenance is the connection system to the cells. Secure connections of the cells to the charging and testing system is essential to maintain proper control of the formation and testing processes. The connections are subject to repeated cycling that can result in wear to the connection system. The connection system also is subject to the accumulation of contaminants that can interfere with the connection, and is exposed to a relatively significant risk of damage during normal use when cells are placed within and removed from the charging and testing system.

The performance capabilities of rechargeable batteries are evaluated and tested by computerized charging and testing equipment during and after manufacture to determine whether the batteries are performing in accordance with appropriate operational standards and design specifications. To evaluate the operational integrity of batteries, the testing equipment is programmed to measure the cell voltage and current under various conditions. Charging and testing equipment must be properly calibrated at all times to evaluate cell integrity and provide an accurate determination of electric energy needed to be applied to the cell to bring the operating characteristics of the cell into substantial agreement with appropriate standards for the battery. Traditionally, manual adjustment and calibration of the testing circuitry has been required to achieve compliance with process control and data acquisition requirements. However, manual adjustment of the circuitry is tedious and labor intensive because of the large number of inputs required (in general, one voltage input and one current input per cell) and high density packaging of equipment for each group of cells. Operator error can result in improper calibration of the testing equipment and inaccurate test results. Furthermore, when batteries are tested, proper calibration of the charging and testing equipment is essential to maintain the state of the charge within specific parameters for the cells. If the cell becomes overcharged, it may be damaged or even explode, causing damage to the charging and testing system and potential injury to the operator.

Therefore, it is desirable to develop an improved method and system for charging and testing circuitry used to form and evaluate multiple battery cells with minimal operator intervention under the control of a microprocessor. Such a charging and test system should provide accurate calibration of charging and testing circuitry for each cell to be tested. Because of the large number of battery cells routinely tested by the system, the charging and test system must have a durable construction, and preferably allow for quick and easy replacement of equipment used to connect the cells to the charging and testing equipment if such connecting equipment is damaged or becomes inoperable. This capability would facilitate the continuous operation of the charging and testing equipment and improve the efficiency of formation and testing procedures.

BRIEF SUMMARY OF THE INVENTION

Accordingly, one object of the present invention is to provide a new and improved method and system for battery charging and testing that provides for semi-automatic calibration of associated testing and charging equipment.

Another object of this invention is to provide an improved method and system for battery charging and testing with semi-automatic calibration that includes a plurality of new and improved pin assemblies having a durable construction for establishing electrical connection between a cell tray or calibration tray and the testing and charging equipment.

Still another object of this invention is to provide an improved method and system for battery charging and testing with semi-automatic calibration wherein each pin assembly can be quickly and easily disconnected and replaced if it becomes damaged or worn out.

Another object of this invention is to provide an improved method and system for battery charging and testing with semi-automatic calibration that can process a large number of battery cells simultaneously, and maintain accurate control of formation, data acquisition and testing processes for each cell at all times.

Yet another object of this invention is to provide an improved method and system for battery charging and testing with semi-automatic calibration that requires minimal operator intervention during charging, testing and calibration processes to load, connect, process, disconnect and unload cell trays and calibration trays to and from the charging and testing equipment.

These and other objects and advantages will become apparent to those skilled in the art in light of the following disclosure and accompanying drawings.

In accordance with the invention, generally stated, a system is disclosed for calibrating each of a plurality of electrical circuits used to charge and test a plurality of battery cells that includes a memory device for storing data representative of operational characteristics for each cell and each circuit. Charging and testing means is provided that includes a data processing circuit electrically connected to the memory device for performing a sequence of operations including calibration, charging and testing operations based on data stored in the memory device. At least one calibration tray is employed to calibrate the circuitry, where each tray has a first electrically conductive contact plate and a second electrically conductive contact plate that is electrically insulated from the first contact plate.

Calibration circuitry also is provided for generating one or more known calibration standards. The calibration circuitry is electrically connected to the contact plates and the charging and testing means. The data processing circuit actuates the calibration circuitry to alternately apply one of the calibration standards to the contact plates. The charging and testing means monitors and evaluates operational characteristics for each circuit based upon the calibration standard applied to the contact plates by the calibration circuitry. The charging and testing means also determines the values of correction factors to be applied to each circuit based upon the operational characteristics of each circuit when connected to the contact plates. The data processing circuit stores data representative of operational characteristics and correction factors for each circuit in the memory device. The data processing circuit also applies appropriate correction factors to each circuit during subsequent testing and charging of each cell.

Means is provided for electrically connecting the battery cells or the contact plates associated with the calibration tray to each of the circuits used to test and charge the battery cells. The electrical connection means generally includes a pair of movable platens electrically connected to the control circuitry and slidably mounted within a cell rack module. The cells or calibration tray are disposed between the pair of movable platens when the cells or calibration tray are inserted in the cell rack module. The movable platens are adapted for movement toward the cells or calibration tray to an extended position and away from the cells or calibration tray to a retracted position.

The preferred embodiment of the electrical connecting means further includes a plurality of electrically conductive pin assemblies mounted to the movable platens. The number of pin assemblies mounted on each platen corresponds to the number of batteries to be charged and tested. Each pin assembly has a first end portion electrically connected to the charging and testing means and extending outwardly from each platen in a direction away from the cell or calibration tray, and a second end portion extending inwardly from each platen in a direction towards the cell or calibration tray. The cell terminals or contact plates associated with the calibration tray are maintained in electrical communication with the second end portions of the pin assemblies when the movable platens are in the extended position.

Yet another aspect of the present invention is that of a method for calibrating each of a plurality of circuits used to charge and test one of a plurality of battery cells, comprising the steps of:

● inserting a calibration tray including a pair of electrically isolated contact plates into a cell rack module;

● electrically connecting the contact plates to each circuit;

● sequentially applying one or more predefined calibration standards to each circuit;

● evaluating operational characteristics of each circuit when subjected to each calibration standard;

● storing data in a memory device representative of operational characteristics of each circuit for each calibration standard applied thereto;

● generating one or more correction factors for each circuit based upon data stored in the memory device;

● storing data in the memory device representative of the correction factors for each circuit; and ● applying the correction factors to each circuit during subsequent testing and charging of the battery cells.

Other objects and features will be apparent and in part pointed out hereinafter.

BRIEF DESCRIPTION OF THE SEVERAL VIEWS OF THE DRAWINGS

The objects of the invention are achieved as set forth in the illustrative embodiments shown in the drawings which form a part of the specification.

In the drawings.

FIG. 5 is a top view of one embodiment of the cell rack module, illustrating a plurality of pin assemblies mounted on an upper movable platen;

FIG. 6 is a front view of the cell rack module shown in FIG. 5, showing the upper and lower movable platens in retracted positions;

FIG. 7 is a side view of the cell rack module shown in FIG. 6, showing the upper and lower movable platens in retracted positions, and having the extension springs removed to illustrate the air flow valves and air cylinders;

FIG. 13 is an isometric view of the calibration tray;

FIG. 14 is an isometric view of the cell tray; and

Corresponding reference numerals will be used throughout the several figures of the drawings.

DETAILED DESCRIPTION OF THE INVENTION

The following detailed description illustrates the invention by way of example and not by way of limitation. This description will clearly enable one skilled in the art to make and use the invention, and describes several embodiments, adaptations, variations, alternatives and uses of the invention, including what we presently believe is the best mode of carrying out the invention.

Figure 1:
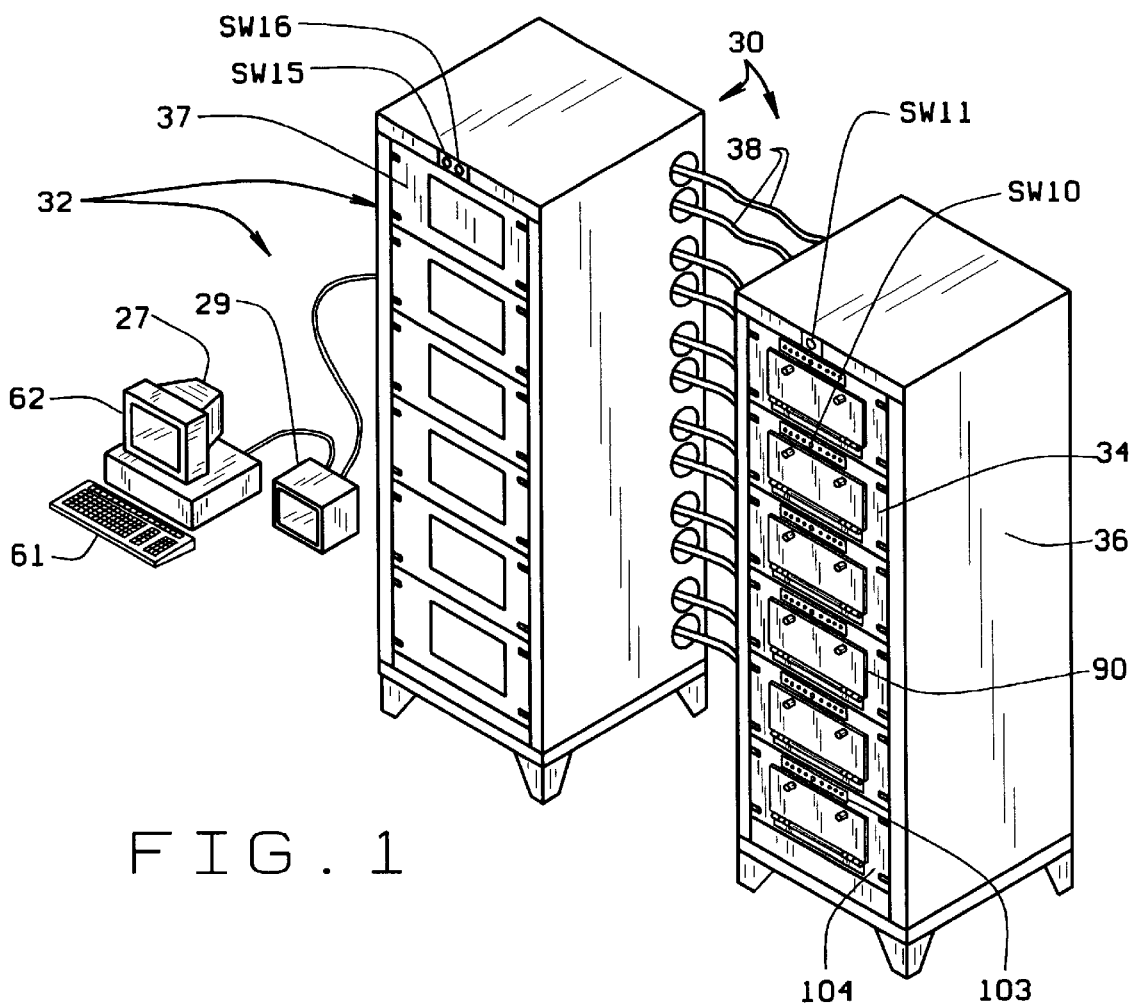
FIG. 1 is a isometric view of one illustrative embodiment of a battery charging and testing system of the present invention, showing testing and charging equipment connected to a plurality of cell rack modules used to support calibration trays or cell trays.

Referring now to FIG. 1, there is shown one illustrative embodiment of a battery charging and testing system of the present invention, indicated generally at 30, including a plurality of charger modules 37 associated with battery charging and testing equipment 32, and a plurality of cell rack modules 34 contained in a cell rack cabinet 36. Each cell rack module 34 is operably connected to one charger module 37 by a plurality of connecting cables 38. As discussed below, each charger module 37 generally includes charging and testing circuitry 53 (FIG. 2) that is operably connected to a computer system 27 and a network adapter 29. Each cell rack module 34 is adapted to receive therein either a calibration tray 40 (FIG. 13) for calibrating the charging and testing equipment 32, or a cell tray 42 (FIG. 14) containing a plurality of battery cells 44 therein that are formed or evaluated by the charging and testing equipment 32. As will be appreciated by those skilled in the art, the present invention can be used with battery assemblies having one or more electrochemical cells. As discussed below, the calibration tray 40 is used to calibrate all circuits or electrical channels associated with the charging and testing equipment 32 that are employed when the battery cells 44 are connected to the system 30. After each circuit or channel associated with the cell rack module 34 for the charging and testing equipment 32 is properly calibrated, the calibration tray 40 is removed from the cell rack module 34, and one cell tray 42 is inserted into the calibrated cell rack module 34 so the cells 44 can be charged and tested. A plurality of coaxial pin assemblies 48 supported by at least one movable platen 50 (FIGS. 6–8) are included in the cell rack modules 34 to connect the calibration tray 40 or cell tray 42 to the connecting cables 38. In the preferred embodiment, platen stiffeners 51 are secured to the platens 50 to provide additional structural support. As discussed below in greater detail, when tray 40 or 42 is inserted in the cell rack module 34, an electrical path (or circuit or channel) is established between the battery testing and charging equipment 32 and the calibration or cell tray 40, 42 via the pin assemblies 48 and the connecting cables 38.

As shown in FIG. 13, each calibration tray 40 includes two contact plates 52, namely a first or upper (top) contact plate 52a that acts as a positive terminal, and a second or lower (bottom) contact plate 52b that acts as a negative terminal. The upper and lower plates 52 are electrically insulated by an insulating material 49 such as, for example, fiberglass reinforced polyester (FRP) or other similar fiberglass resin materials. The location and orientation of the first (positive) and second (negative) contact plates 52 within the cell rack module 34 correspond to the location and orientation of positive and negative electrodes associated with the battery cells 44 on the cell trays 42 when the cell trays 42 are inserted in the cell rack modules 34. The contact plates 52 are electrically connected to control circuitry 118 (discussed below and shown in FIG. 4). The control circuitry 118 preferably is mounted on a printed circuit board 51 included in the calibration tray 40 and shown in FIG. 13 (except for resistors R1–R11 and R15 (discussed below)). The control circuitry 118 exhibits known voltage and resistance characteristics that are used by charging and testing equipment circuitry 53 (discussed below and shown in FIG. 2) to accurately calibrate each circuit associated with the charging and testing equipment 32 that tests each battery cell 44.

Figure 2:
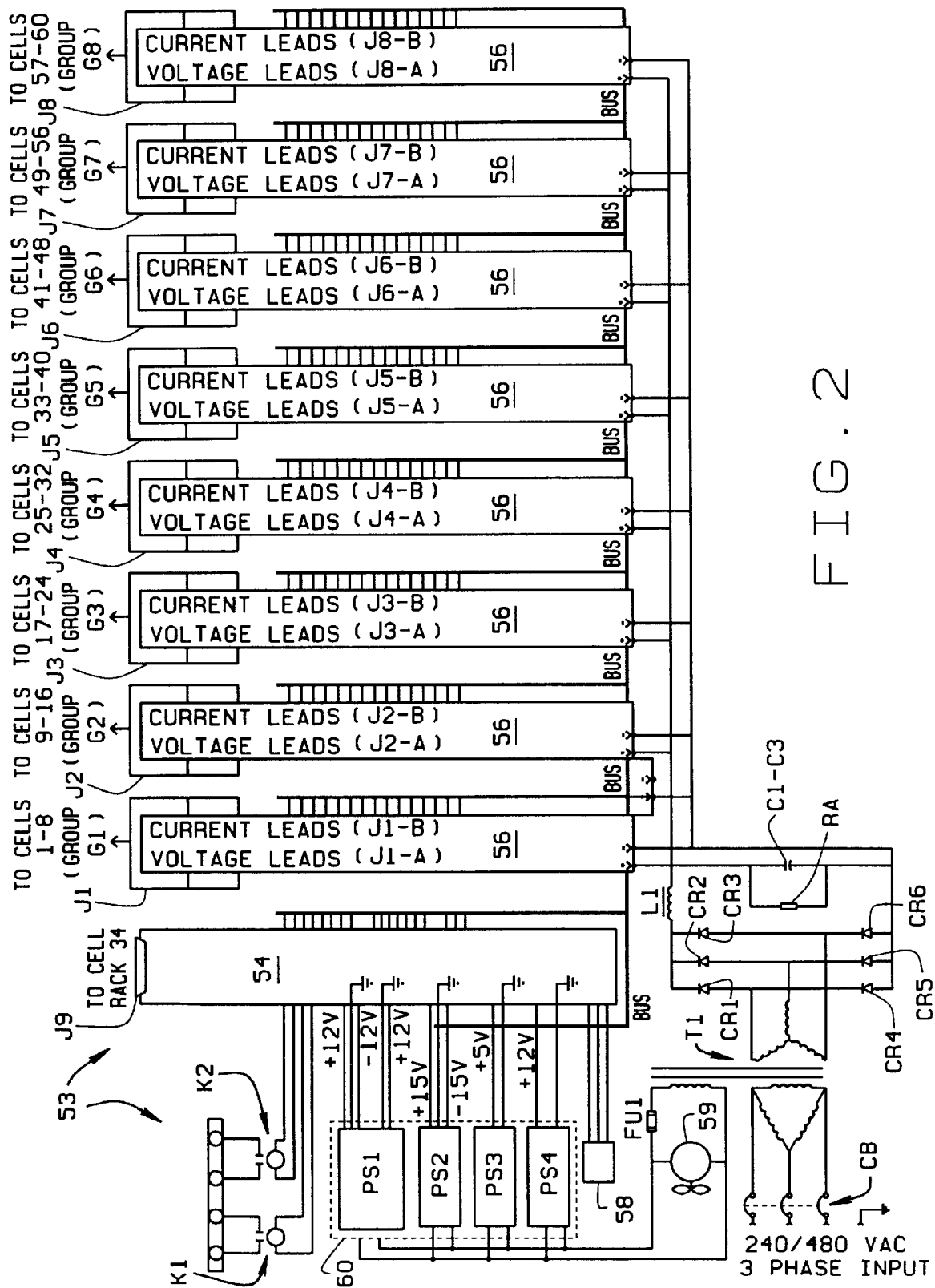
FIG. 2 is a is a schematic diagram of the charging and testing circuitry associated with the charging and testing equipment of the present invention.

As shown in FIG. 2, each charger module 37 of the battery testing and charging equipment 32 includes charging and testing circuitry 53. The charging and testing circuitry 53 includes a central processing unit (CPU) having a microprocessor, microcomputer or similar data processing system 54 that executes preprogrammed instructions stored in an internal memory device (not shown) to perform a sequence of operations set forth below on calibration tray 40. The microprocessor 54 evaluates the operation of electrical channels to compensate for errors in the acquisition of data measured by a plurality of data acquisition and control circuits or assemblies 56 included in the charging and testing circuitry 53. As discussed in greater detail below, the operations of the data acquisition and control assemblies 56 are controlled by the microprocessor 54. After the charging and testing equipment 32 is properly calibrated and the cell trays 42 are inserted into the cell rack modules 34, the microprocessor 54 performs a sequence of operations on the cells 44 disposed on each cell tray 42 through the data acquisition and control assemblies 56. As shown in FIG. 1, the testing equipment 32 further includes a data communication interface that allows an operator to input data and operational instructions relating to the cells 44 to be tested, while transmitting acquired data and operational information from the charging and testing equipment 32 to the operator. The data communication interface includes the computer system 27 and network adapter 29. The computer system 27 includes a keyboard 61 that allows for data input and a display device or monitor 62 that allows the operator to examine calibration and test results.

As discussed below in greater detail and shown in FIG. 8, each contact plate 52 on the calibration trays 40 or one or more cells 44 on the cell trays 42 is electrically connected to each channel of the charging and testing equipment 32 via one or more pairs of pin assemblies 48. When the calibration tray 40 is disposed in the cell rack module 34, all channels are connected simultaneously to the contact plates 52 through each pair of pin assemblies 48. When the cells 44 are placed in the cell rack module 34, each cell is connected to a particular channel of the charging and testing equipment 32 through one pair of pin assemblies 48. As discussed below and shown in FIGS. 3, 13 and 14, the microprocessor 54 stores data in a memory device 134 or 135 associated with each calibration tray 40 or cell tray 42, respectively, that identifies each tray, and the location and characteristics of each cell 44 on the cell trays 42.

Data acquisition is performed through operation of the data acquisition and control assemblies 56, each of which contains several input/output channels. As discussed below in greater detail, a center voltage pin assembly 71 associated with each coaxial pin assembly 48 is used to establish an electrical path that connects the contact plates 52 of the calibration tray 40 or cell terminals of the cells 44 in the cell tray 42 to one of a plurality of voltage measurement amplifiers 63 (FIG. 15) included in the data acquisition and control assemblies 56. The connection of the center voltage pin assemblies 71 to the cell terminals eliminates errors in voltage measurement due to current flow to the cell. Current flowing through an outer current pin assembly 75 associated with each coaxial pin assembly is measured through one of a plurality of shunt/voltage measurement amplifier circuits 65 (FIG. 15) included in the data acquisition and control assemblies 56.

Figure 15:
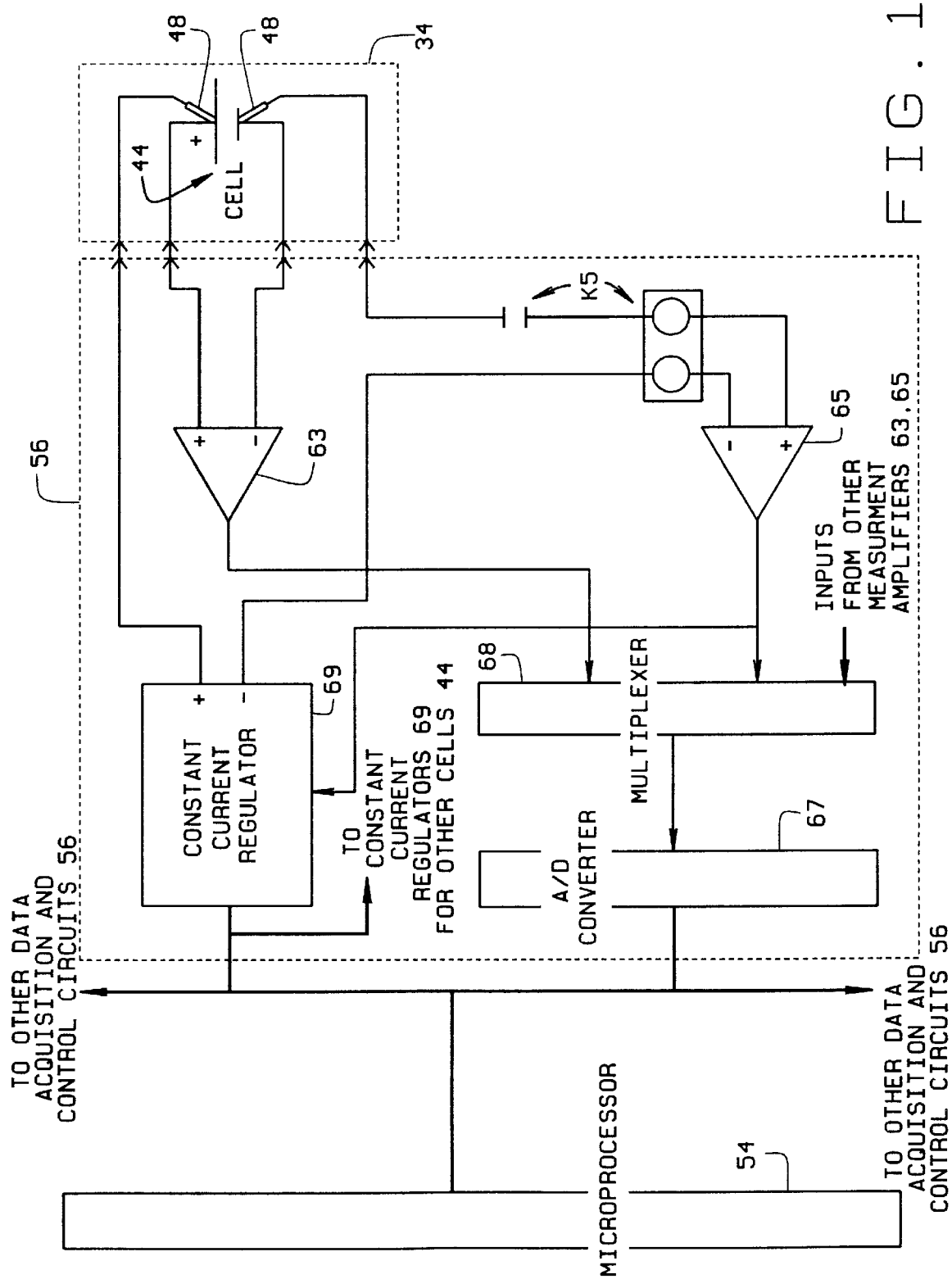
FIG. 15 is a schematic drawing showing data acquisition and control circuitry associated with an electrical circuit connecting a pair of pin assemblies to the microprocessor.

The output signals of the voltage and shunt/voltage measurement amplifiers 63, 65 are multiplexed into an analog-to-digital (A/D) converter 67 via a multiplexer 68 (FIG. 15). The analog-to-digital converter 67 converts the output of each amplifier 63, 65, in sequence, to digital data that is processed by the microprocessor 54. Based upon the programmed instructions and measured levels of current and voltage, the microprocessor 54 adjusts a plurality of internal constant-current regulators 69 (FIG. 15) (one regulator per channel) associated with each data acquisition and control assembly 56 to produce and maintain the programmed voltage and current conditions at the cell 44. The direction of current flow in these regulators 69 can be reversed by microprocessor 54 to facilitate either charging or discharging of the cells 44. When the constant current regulators 69 are in a charge mode during the charging and testing procedures, current flows through the cells in one direction (from cathode to anode) to produce the desired electrochemical reactions within the cell. When the constant current regulators 69 are in a discharge mode during the charging and testing procedures, current flows through the cell in the opposite direction (from anode to cathode). As set forth below, the microprocessor 54 places the constant current regulators 69 into either the charge mode or the discharge mode during voltage and current calibration procedures.

The microprocessor 54 accepts a discrete input signal from an airflow sensor 58 (FIG. 2), which signals the microprocessor 54 when cooling fans 59 used in the charging and test equipment 32 are not producing sufficient airflow to prevent overheating of the constant current regulators 69 associated with the data acquisition and control assemblies 56. The microprocessor 54 also controls two programmable contact outputs associated with relays K1 and K2 for signaling other equipment (e.g., an external horn or light) as dictated by programmed instructions that can be specifically tailored for a particular application.

In the preferred embodiment, an internal transformer T1, rectifiers CR1–CR6, choke L1, resistor RA, capacitors C1–C3, and four DC power supplies PS1, PS2, PS3, and PS4 (indicated generally at block 60) shown in FIG. 2 provide various DC voltages and currents necessary for the charging and test equipment 32 to perform its intended functions. The transformer T1 is connected to a 240/480 VAC power supply via circuit breaker CB. Fuse FU1 provides overcurrent protection to the circuitry 53.

FIG. 2 generally shows the interconnection of the data acquisition and control circuitry 56 associated with the testing equipment 32 to eight cell groupings G1–G8 on the cell tray 42. In the preferred embodiment, sixty (60) cells 44 are disposed on each cell tray 42 such that at least sixty (60) pin assemblies 48 are included on the upper and lower movable platens 50 (for a total of 60 pairs of pin assemblies 48). The cells 44 on the cell tray 42 are arranged such that groupings G1–G7 each include eight cells 44, and grouping G8 includes four cells 44. Similar groupings are used to refer to pin assemblies 48 located in corresponding positions of the movable platens 50.

Figure 3:
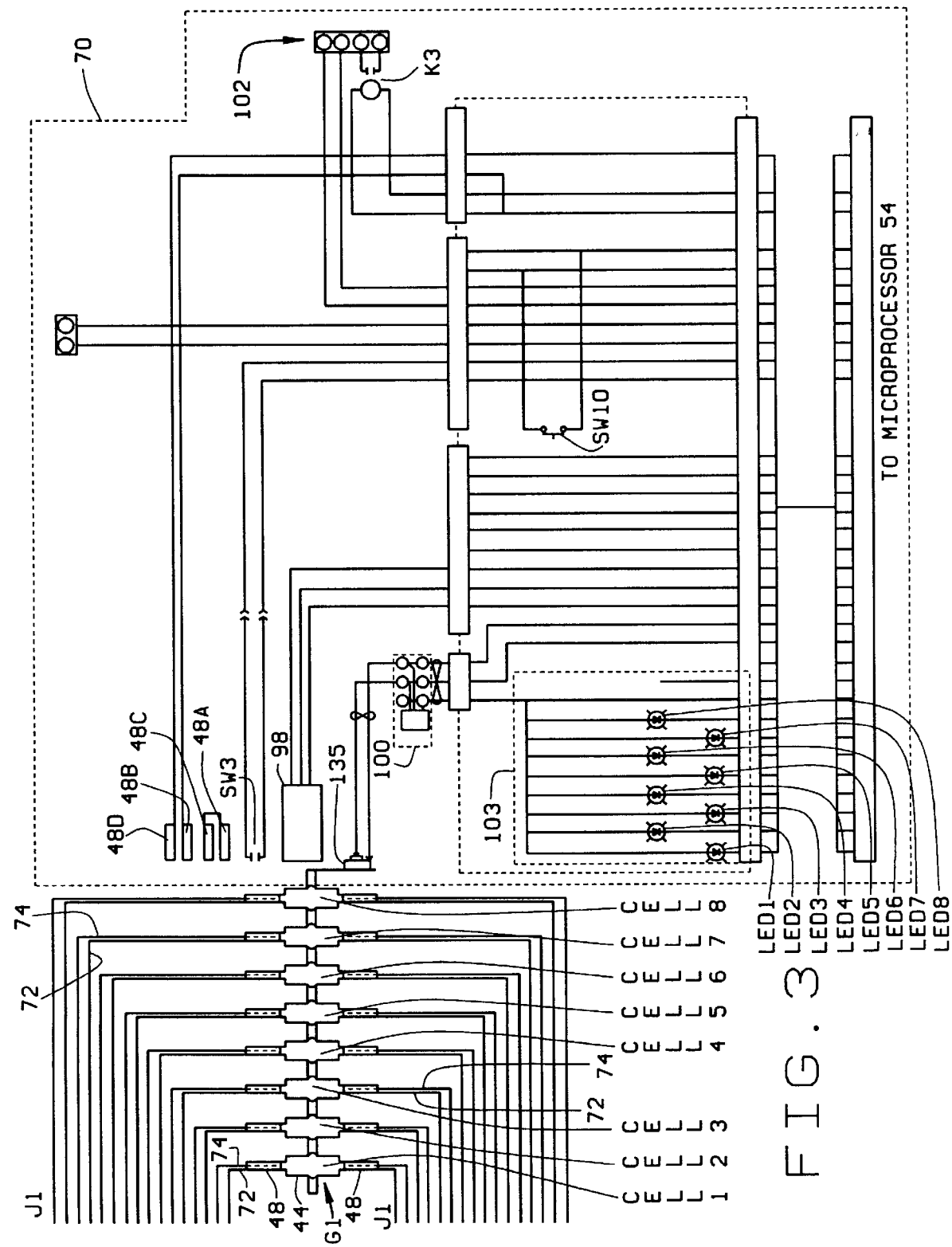
FIG. 3 is a schematic diagram of circuitry associated with one cell rack module, showing the connection of the cell rack module circuitry to the testing and charging circuitry, and to a group of battery cells associated with a cell tray that is inserted into one cell rack module.

FIG. 3 schematically illustrates the connection of one cell grouping G1 including eight cells 1–8 associated with one cell tray 42 to one of the data acquisition and control assemblies 56, and the connection of the microprocessor 54 to electrical circuitry 70 associated with each cell rack module 34. A pair of pin assemblies 48 is used to test each cell 44 on the tray 40, with one pin assembly 48 being electrically connected to the positive electrode of each cell 44 and the other pin assembly 48 being electrically connected to the negative electrode. As discussed below and shown in FIG. 3, a current pin lead 72 and a voltage sense lead 74 extend from each pin assembly 48. The current and voltage leads employed for each of the groupings G1–G8 are served by a single connector J that is operably connected to the data acquisition and control assemblies 56 as indicated in FIG. 2. More specifically, cells 1–8 in grouping G1 are serviced by connector J1; cells 9–16 in grouping G2 are serviced by connector J2; cells 17–24 in grouping G3 are serviced by connector J3; cells 25–32 in grouping G4 are serviced by connector J4; cells 33–40 in grouping G5 are serviced by connector J5; cells 41–48 in grouping G6 are serviced by connector J6; cells 49–56 in grouping G7 are serviced by connector J7; and cells 57–60 in grouping G8 are serviced by connector J8. When the calibration tray 40 is inserted in the cell rack module 34 in place of the cell tray 42, the pin assemblies 48 are electrically connected to the contact plates 52 in a similar fashion. It is important to note that the arrangement and number of cells 44 and cell groupings (and pin assemblies 48 and pin assembly groupings) can be varied without departing from the scope of this invention.

The cell rack module 34 structure of the preferred embodiment includes a substantially rectangular top fixed platen or cover 80 having an access hole 81 formed therein, a bottom fixed platen or base 82 generally having overall peripheral dimensions corresponding to those of the top platen 80, and four vertical supports 84 extending between the top platen 80 and the bottom platen 82 in the vicinity of the four corners of the cell rack module 34 shown in FIGS. 5–8 so as to define an opening 88 therebetween in which is inserted the calibration tray 40 or the cell tray 42. As shown in FIG. 1, a door 90 is hingably mounted to the front of each cell rack module 34 which can be opened to insert or remove a tray 40 or 42, and closed during operation of the system 30. A magnetic door switch SW3 (shown in FIG. 3) is actuated when the door 90 is closed, and transmits a signal to the microprocessor 54 indicating that the door 90 is closed. The microprocessor 54 will not execute testing or calibration operations until the door 90 of the cell rack module 34 is closed.

Figure 8:
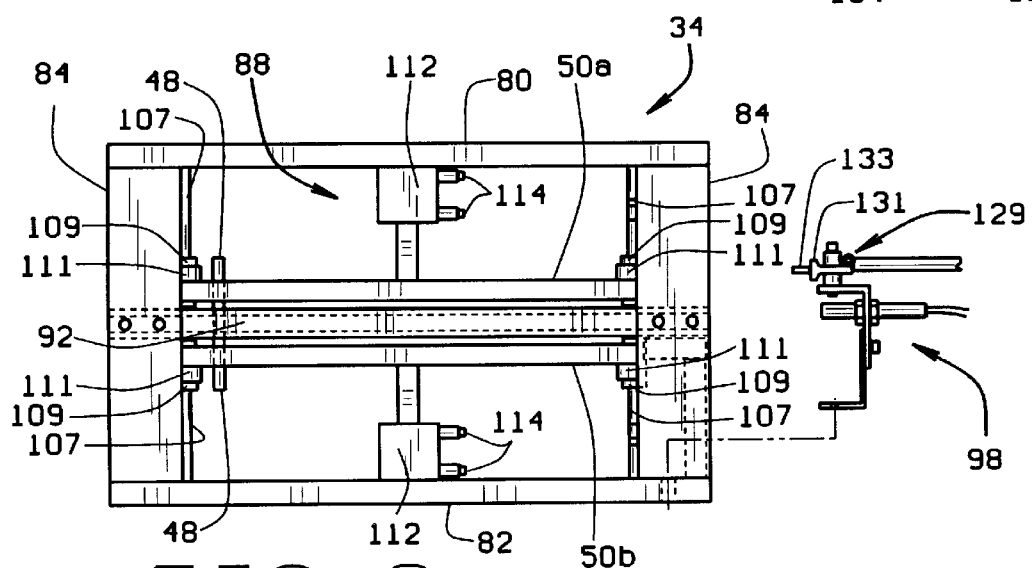
FIG. 8 is a side view of the cell rack module shown in FIG. 6, showing the upper and lower movable platens in extended positions, and having the extension springs removed to illustrate the air flow valves and air cylinders.

A pair of guide rails 92 shown in FIGS. 6–8 are mounted on the vertical supports 84 to support and position the tray when it is inserted in the cell rack module 34. The cell rack module 34 also includes a detent ball assembly 94 shown in FIG. 6 that engages an opening (not shown) associated with the calibration tray 40 or cell tray 42 when either tray 40 or 42 is inserted into the guide rails 92 to prevent tray movement or misalignment of the battery cells 44. As shown in FIGS. 3, 7 and 8, the cell rack module 34 includes a proximity sensor 98 that senses the presence of the calibration tray 40 or cell tray 42 in the cell rack module 34. Upon detection of a tray in the cell rack module 34 (FIG. 7), the proximity sensor 98 transmits a signal to the microprocessor 54 indicating whether the calibration tray 40 or cell tray 42 has been inserted. The operator then presses a manual start button SW10 associated with each cell rack module 34 (FIGS. 1 and 3) which transmits a signal to the microprocessor 54 which, in turn, triggers the microprocessor 54 to execute the appropriate algorithms to calibrate the circuitry or test the batteries 44. The microprocessor 54 will not commence any testing or calibration procedures until the sensor 98 indicates that tray is properly positioned within the cell rack module 34 (FIG. 7). As discussed above and below, the microprocessor 54 also requires that the door switch SW3 indicates the door 90 is closed, the pins 48 are engaged with the calibration tray 40 or cell tray 42, and that information stored in an on-tray memory chip 134, 135 is read by the microprocessor 54 before any testing or calibration procedures begin.

As shown in FIG. 1, the cell rack cabinet 36 also includes an emergency stop button SW11 which terminates any charging or testing operations when pressed by the operator. Similarly, the charging and testing equipment 32 includes an emergency stop button SW15 that terminates any charging or testing operations when pressed. A reset button SW16 also is provided to reset the charging and testing equipment 32 after switch SW11 or switch SW15 has been pressed.

A group of light emitting diode (LED) indicators 103 including LEDs 1–8 are located on a front panel 104 of the cell rack modules 34 as shown in FIGS. 1 and 3. These indicators 103 are used to indicate the operational status of the charging and testing system 30. In the preferred embodiment, illumination of LED 1 indicates a fault is detected in the charging and testing circuitry; illumination of LED 2 indicates tray fault; illumination of LED 3 indicates the cell rack door 90 is open; illumination of LED 4 indicates the tray is ready and properly positioned for charging or testing; illumination of LED 5 indicates the system is running; illumination of LED 6 indicates the system has stopped; illumination of LED 7 indicates the testing or charging processes are completed; and illumination of LED 8 indicates the occurrence of a user-definable status based upon preprogrammed instructions (e.g., the completion of one phase of the battery charging process).

Depending upon the configuration of the battery cell 44 to be tested, the pin assemblies 48 are mounted in the cell rack module 34 either on a single movable platen 50, or on two movable platens 50 (e.g., a top or upper platen 50a and a bottom or lower platen 50b as shown in FIGS. 6–8). For example, when the positive and negative terminals (electrodes) are disposed at opposite ends of the cell 44 such as in a cylindrical cell construction, upper and lower platens 50 are used to house the pin assemblies 48 such that pin assemblies 48 associated with the top platen 50a are electrically connected to one electrode of each battery cell 44 contained in the cell tray 42, and the pin assemblies 48 associated with bottom platen 50b are electrically connected to the other electrode of the cell 44 during charging and testing procedures. The top and bottom platens 50 are slidably mounted within the cell rack module 34, allowing for movement in an upwardly and downwardly direction. The top platen 50a can be moved in an upwardly direction and the bottom platen 50b can be moved in a downwardly direction away from the calibration or cell tray 40, 42 into retracted positions such that the pin assemblies 48 are not in electrical communication with the contact plates 52 of the calibration tray 40 or battery cells 44 (see FIG. 7). The platens 50 are maintained in the retracted or disengaged positions when the cell or calibration trays 42, 40 are removed from the cell rack module 34, or when the charging and testing equipment 32 is not in use. When the cell or calibration trays 42, 40 properly are inserted into the cell rack modules 34, the top platen 50a is moved downwardly and the bottom platen 50b is moved upwardly towards the tray into extended positions such that the pin assemblies 48 are electrically connected to the electrodes of the battery cells 44 located in the cell tray 42 or the contact plates 52 of the calibration tray 40 (FIG. 8).

Each cell rack module 34 includes at least one extension mechanism operably connected to each movable platen 50 for controlling inward movement of the movable platens toward the cell or calibration tray 42, 40, and at least one retraction mechanism operably connected to each movable platen 50 for controlling outward movement of the platens 50 away from the cell or calibration tray 42, 40 into the retracted position. In the preferred embodiment, the extension mechanisms are operably connected to the microprocessor 54 such that the microprocessor 54 triggers the extension mechanisms to move the platens 50 into the extended position when the tray 40 or 42 is properly inserted into the cell rack module 34 and the door 90 is closed.

When the positive and negative electrodes are disposed on the same side of the battery cell (not shown), only one platen 50 (either a top platen 50a or a bottom platen 50b) is required to house the pin assemblies 48, depending upon the upward or downward orientation of the cell 44 electrodes in the cell rack module 34. As discussed above with respect to the two platen configuration, the single platen 50 used in this situation is slidably mounted within the cell rack module 34 such that the pin assemblies 48 can be selectively moved inwardly toward the tray 40 or 42 (by the extension mechanism) and outwardly away from the tray 40 or 42 (by the retraction mechanism). Thus, the pin assemblies are selectively moved into or out of electrical contact with the electrodes or terminals of the cells 44 on the cell tray 42 or contact plates 52 on the calibration tray 40.

As shown in FIG. 6, the retraction mechanisms associated with the preferred embodiment of the cell rack module 34 include two pairs of extension springs 105, with one pair being used to secure the top platen 50 to the top fixed platen 80, and the other pair being used to secure the lower movable platen 50b to the bottom fixed platen 82. The cell rack module 34 also includes eight guide pins 107, with four guide pins 107 secured the top platen 80 and four guide pins 107 secured bottom fixed platens 82 as shown in FIGS. 5–8. The movable platens 50a, 50b are secured to the guide pins 107 via bearings 109 and bearing spacers 111 that allow for slidable movement of the movable platens 50a, 50b on the guide pins 107 between a retracted position (FIGS. 6 and 7) and an extended position (FIG. 8).

The extension mechanisms used in the preferred embodiment include two sets of air cylinders 112, with an air flow control valve 114 mounted on each set 112 to regulate the speed at which the moving platens 50a, 50b engage and disengage the pins 44. The extension springs 105 are located adjacent to each air cylinder 112 as shown in FIG. 6. The air cylinders 112 are used to move the movable platens 50a, 50b inwardly away from the fixed platens 80, 82 into the extended position during charging, testing and calibration procedures. When charging, testing, or calibration procedures are completed, the extension springs 105 move the movable platens 50a, 50b outwardly towards the fixed platens 80, 82 into the retracted positions. Upon receiving a signal to engage the pins 48 with the battery cells 44, an electric solenoid valve (not shown) mounted on a manifold (not shown) inside the cabinet 36 (FIG. 5) is actuated, thereby pressurizing air lines extending between the valves and the air cylinders 112 and causing the air cylinders 112 to extend. In the preferred embodiment, each solenoid valve has an "A" line and a "B" line which connects to an air fitting assembly 110. The air fitting assembly 110 splits and distributes each "A" and "B" line to the four air cylinders 112. As the air cylinders 112 extend, the movable platens 50a, 50b are moved into the extended positions such that the pin assemblies 48 are maintained in electrical communication with the battery connections. In the preferred embodiment, pressurizing the A line extends the air cylinders 112, and pressurizing the B lines retracts the air cylinders 112.

It is important to note that while the preferred embodiment of the present invention employs air cylinders 112 and extension springs 105 to move the platens between the extended and retracted positions, any extension or retraction mechanisms can be used in the present invention that allow for controlled movement of the platens 50 toward and away from the trays 40, 42. For example, as will be appreciated by those skilled in the art, cam-type actuators or a set of ball screws driven from a common motor can be used to move the platens 50 between the extended and retracted positions.

The preferred embodiment of the cell rack module 34 as shown in FIG. 3 also includes an ambient air temperature sensor 100 that is operably connected to the microprocessor 54 of the testing circuitry 53 to measure the air temperature in the vicinity of the cells 44. Air pressure used to move platens 50 within each cell rack module 34 is monitored by an air pressure sensor 102 that detects loss of air pressure. When insufficient air pressure is detected by the sensor 102, the sensor 102 transmits a signal to the microprocessor 54 indicating insufficient air pressure, and triggers the microprocessor 54 to stop all output from the charging and testing equipment 32. The microprocessor 54 halts operation, and does not commence any charging or testing operations until sufficient air pressure is detected by the sensor 102.

FIG. 5 shows the top view of one cell rack module 34 used in the preferred embodiment of the present invention, showing the upper movable platen 50a through the access hole 81 formed in the top fixed platen 80. The upper platen 50a has a substantially flat, rectangular shape with a plurality of openings formed therein. As discussed below, the pin assemblies 48 are secured within these openings. As discussed above, the preferred embodiment of the tray includes sixty (60) pin assemblies 48 positioned on each platen 50 such that each pin assembly 48 corresponds to the location of one battery cell 44. Four control contact pin assemblies 48A, 48B, 48C and 48D (discussed below) also are provided on the top platen 50a only for connection to four control contact pads A, B, C, D that protrude through openings formed in the top contact plate 52a of the calibration tray 40. The contact pads A–D are electrically isolated from the top plate 52a, and flush with the top plate surface.

Figure 4:
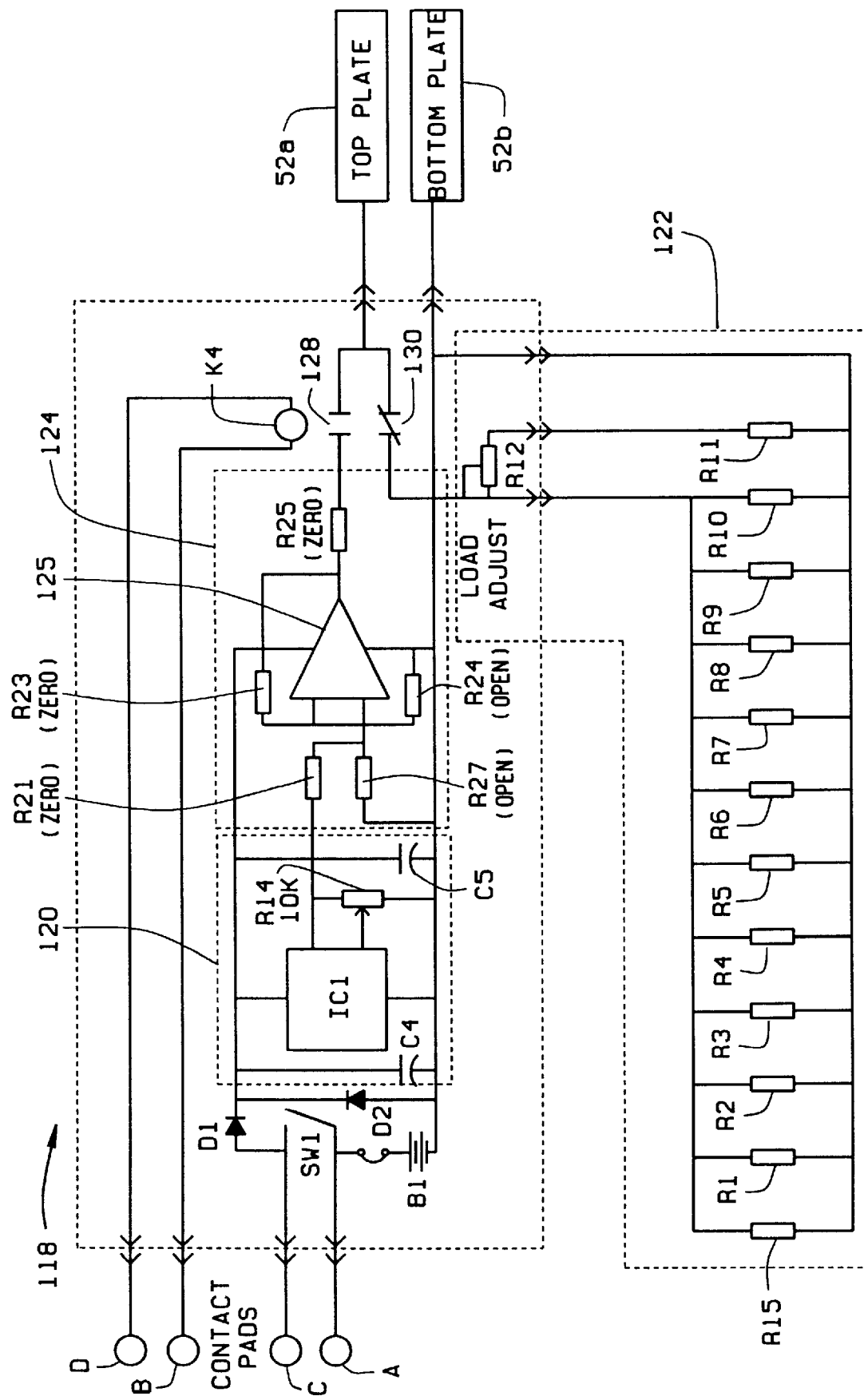
FIG. 4 is a schematic diagram of control circuitry associated with a calibration tray that interfaces with the charging and testing circuitry through the cell rack module.

As discussed above, each calibration tray 40 includes control circuitry 118 (FIG. 13) that interfaces with the charging and testing circuitry 53 to calibrate each circuit used to evaluate the operational integrity of each battery 44. As shown in FIG. 4, the control circuitry 118 includes a precision, low current voltage source 120 set to the system full-scale voltage, and a precision load resistor array 122 including a parallel combination of resistors R1, R2, R3, R4, R5, R6, R7, R8, R9, R10, R11, and R15 and an adjustable resistor R12. In the preferred embodiment, resistors R1, R2, R3, R4, R5, R6, R7, R8, R9, R10, R11, and R15 are physically mounted to the contact plates 52a, 52b associated with the calibration tray 40. As discussed above, the remaining circuitry components associated with control circuitry 118 are mounted on the printed circuit board 51. The load resistor array 122 can be calibrated against known standards by manual adjustment of the adjustable resistor R12. Similarly, the voltage source 120 can be calibrated against known standards by manual adjustment of an adjustable resistor R14. The voltage source 120 includes a 9 volt battery B1 that is connected to a precision reference voltage integrated circuit IC1 and a buffer amplifier 125 when switch SW1 is in a closed position (used for testing of the voltage source 120). When the pins 48 engage the upper contact plate 52a, the 9 V battery B1 is connected to the rest of the circuit 118 to provide operating power through control contact pads A and C (FIG. 13) on the upper contact plate 52a and pin assemblies 48A and 48C (FIG. 5), respectively. The integrated circuit IC1 converts the DC voltage of battery B1 into a standard precision reference voltage used in calibration of the charging and testing equipment 32. The output of the voltage source is processed by an amplification circuit 124 including an operational amplifier 125 and associated resistors R21, R22, R23, R24 and R25.

The control circuitry 118 further includes a relay K4 having a first pair of normally open contacts 128 effectively connected between the output of the amplification circuit 124 and the upper contact plate 52a of the calibration tray 40, and a second pair of normally closed contacts effectively connected between the load resistor array and the upper contact plate 52a of the calibration tray 40. The relay K4 is operably connected to the microprocessor 54 associated with the charging and testing circuitry 53 via control contact pins B and D shown in FIG. 1, associated pin assemblies 48B and 48D (FIG. 5), and connecting cables 38. The microprocessor 54 controls energization of the relay K4 when the calibration tray 40 is inserted in the cell rack module 34 to alternately apply an output signal generated by either the voltage source 120 or the load resistor array 122 across contact plates 52. As discussed above, the pin assemblies 48 simultaneously are maintained in electrical communication with the contact plates 52 during the calibration process.

The calibration tray 40 also includes an on-board non-volatile random access memory device 134 shown in FIG. 13 that interfaces with the microprocessor 54 of the charging and testing circuitry 53 when the calibration tray 40 is inserted into the cell rack module 34. The memory device 134 stores and maintains data therein, including identification data indicating that the calibration tray 40 is inserted in the testing unit. The microprocessor 54 performs input, processing, storage, output and control functions on data stored in the memory device 134. Identification data stored in the memory device 134 is interpreted by the microprocessor 54 to ascertain that the object inserted in the testing unit is a calibration tray 40. As mentioned above, a memory device 135 is included on each cell tray 42 (FIG. 14) that provides for storage of data, including data identifying the tray 42 and cells contained in the tray 42.

The cell rack module 34 includes a pin assembly 129 having a signal return pin 131 that is maintained in electrical communication with the memory chip 134 or 135 when the calibration tray 40 or cell tray 42 is inserted in the cell rack module. The pin assembly 129 also includes an inner signal contact pin 133 extending outwardly therefrom as shown in FIGS. 7–8 to complete the electrical circuit between the memory device 134 or 135 and the microprocessor 54. More specifically, the signal contact pin 133 and signal return pin 131 are used to electrically connect the memory devices 134, 135 to the microprocessor 54, thereby facilitating signal transmission between the memory device 134, 135 and the microprocessor 54. The pin assembly 129 generally has a substantially similar construction as pin assemblies 48. The return signal pin 131 generally has the same physical construction as a spring pin 167 associated with the pin assemblies 48 (discussed below and shown in FIGS. 9–11), with one end being adapted for engagement with the memory device 134, 135. The return signal pin is positioned inside a receptacle similar to that shown in FIG. 10 and designated as receptacle 166 (discussed below). The pin assembly has a similar construction to that set forth below for voltage sense pin assembly 71. The pin assembly 129 includes two heat shrink tubing sleeves that provide electrical insulation, and also provide a press fit with the return pin 131.

When the microprocessor 54 determines that the calibration tray 40 has been properly inserted in the cell rack module 34, and that the cell rack door 90 is closed, the microprocessor 54 then reads the information stored in the nonvolatile memory device 134 associated with each tray 40. The microprocessor 54 then executes a firmware-driven algorithm to test and calibrate the circuits associated with each pair of pin assemblies 44. Pursuant to this algorithm, the microprocessor 54 first performs voltage calibration processes for each circuit, and then performs current calibration processes for each circuit.

To perform the voltage calibration processes, the microprocessor 54 first sets all outputs of the constant current regulators 69 associated with the data acquisition and control circuitry 54 to a zero output current value, while also switching the regulators 69 to the discharge mode before the pins 44 are moved into connection with the calibration tray 40. As discussed above, the constant current regulators 69 are placed in either the discharge mode or the charge mode during the calibration procedures by the microprocessor 54. As set forth below, the voltage calibration procedures are performed with the constant current regulators 69 maintained in the discharge mode. However, since current measurements must be accurately calibrated during the charge and discharge modes to provide precise control of current flow through the cells, the regulators 69 are switched between the discharge and charge modes during the current calibration procedures set forth below.

Once the regulators 69 are in the discharge mode, the microprocessor 54 then activates a plurality of output relays K5 (see FIG. 15) included in the data acquisition and control circuitry 56 to complete the circuit connection for all channels to the contact plate 52b. One output relay K5 is effectively connected to each pair of pin assemblies 48 to allow for selective connection or disconnection of each pair of pin assemblies 48 to the charging and testing circuitry 53. FIG. 15 illustrates the connection of the data acquisition and control circuitry 56 to one battery cell 44. It will be appreciated based upon the discussion herein that the battery cell 44 is replaced with the two contact plates 52 when the calibration tray is inserted in the cell rack module 34. In this situation, the upper or positive contact plate 52a has an orientation within the cell rack module 34 corresponding to that of the positive terminals of the cells 44, and the lower or negative contact plate 52b has an orientation within the cell rack module 34 corresponding to that of the negative terminals of the battery cells 44.

The microprocessor 54 actuates the relay K4 to connect the load resistor array 122 across the upper and lower contact plates 52 by opening contacts 128 and closing contacts 130. The resistor array 122 has a known value, set at 1.000 Ω in the preferred embodiment. In this situation, the voltage and current between the contact plates 52 should be zero. The microprocessor 54 examines the voltage across the contact plates 52 as measured by each voltage measurement amplifier 63. The voltage measurement amplifier 63 is electrically connected to the voltage sense lead 74 of the corresponding pair of pin assemblies 48. The voltage measured across the positive and negative contact plates 52 is evaluated by the microprocessor 54 to establish a signal level for each circuit or channel that corresponds to zero voltage. More specifically, the microprocessor 54 evaluates the output of the analog-to-digital converter 67 for each voltage measurement amplifier 63. The voltage values measured across the contact plates 52 by each pair of pin assemblies 48 for each circuit are stored in the memory circuit (not shown) associated with the charging and testing circuitry 53 by the microprocessor 54.

After the zero voltage signal level is determined for each circuit associated with each pair of pin assemblies 48, the microprocessor 54 triggers the relay K4 of the control circuitry 118 to disconnect the load resistor array 122 from the contact plates 52 by opening contacts 128, and to connect the precision voltage source 120 to the contact plates 52 by closing contacts 130. The voltage generated by the voltage source 120 is maintained at a known voltage level during the calibration process (e.g., 5 V in the preferred embodiment). The microprocessor 54 then examines the voltage across the contact plates 52 as measured by each voltage measurement amplifier 63. More specifically, the microprocessor 54 evaluates the measured voltage levels across the contact plates 52 by examining the output signal generated by the analog-to-digital converters 67 for each pair of pin assemblies to establish a voltage full-scale point for each circuit. The voltage full-scale point is utilized by the microprocessor 54 to calculate a voltage full-scale calibration constant that is necessary to remove full scale linearity error from analog-to-digital converter measurements for that circuit. This calibration constant can be calculated by subtracting the signal level corresponding to zero voltage measured in the previous calibration step from the voltage full-scale point value generated by the analog-to-digital converter 67 in the present step. The zero voltage values for each circuit and the voltage full-scale calibration constants are stored in the nonvolatile memory 134 by the microprocessor 54.

When the voltage full-scale point is determined for each circuit, the system 30 is calibrated for voltage measurements. The microprocessor 54 then can convert any output signal generated by analog-to-digital converter 67 based upon a voltage level measured by the circuit across any battery cell 44 or any voltage input for any circuit into a calculated value representative of an actual voltage value (in volts) measured by the pins 48 using the following formula:

Actual voltage value=((measured output voltage value generated by A/D converter 67)−(zero voltage signal level))(standard reference voltage value generated by the precision voltage source 120 associated with the calibration tray 40)/(voltage full-scale calibration constant)

After the system 30 is calibrated for voltage measurements, the microprocessor 54 performs operations necessary to calibrate each circuit for current measurements. Pursuant to the firmware-driven algorithm, the microprocessor 54 sets all outputs of the constant-current regulators 69 associated with the data acquisition and control circuitry 54 to a zero output current value. The microprocessor 54 then switches the constant-current regulators 69 associated with all circuits into the charge mode.

The microprocessor 54 then triggers the relay K4 to connect the load resistor array 122 across the upper and lower contact plates 52a, 52b by opening contacts 128 and closing contacts 130. As discussed above, the resistor array 122 has a known value, set at 1.000 Ω in the preferred embodiment. In this situation, the voltage and current between the contact plates 52 should be zero. The microprocessor 54 examines the current flowing through each circuit as measured by the shunt/measurement amplifiers 65 via the pin assemblies 48 by closing all output relays K5 associated with each pair of pin assemblies 48 and included in the data acquisition and control circuitry 56. The shunt/measurement amplifiers 56 are electrically connected to the current pin leads 72 associated with the pin assemblies 48. The microprocessor evaluates the output of the analog-to-digital converter 67 based upon the output signal of the shunt/measurement amplifier 65 for each circuit to establish a signal level for each circuit or channel that corresponds to a charge current zero point value. The charge current zero point values measured for each circuit are stored in the memory circuit associated with the charging and testing circuitry 53 by the microprocessor 54.

The microprocessor 54 then switches the regulators 69 from the charge mode into the discharge mode. The microprocessor 54 evaluates the output of the analog-to-digital converter 67 based upon the output signal of each shunt/measurement amplifier 65 to establish a signal level for each circuit or channel that corresponds to a discharge current zero point value. The discharge current zero point values measured for each circuit are stored in the memory circuit associated with the charging and testing circuitry 53 by the microprocessor 54.

Once the charge current zero point values and the discharge current zero point values are determined, each circuit is calibrated for full-scale current, one circuit at a time. The microprocessor 54 initially disconnects all circuits from the contact plates 52 by setting all relays K5 contacts associated with the circuits into open positions. Then, the microprocessor 54 selects a single circuit, and sets the corresponding relay K5 contacts (where one relay K5 is associated with each pin assembly 48 pair in each circuit) associated with the selected circuit to a closed position to establish an electrical path between the pin assemblies 48 of the selected circuit and the charging and testing circuitry 53. The microprocessor 54 transmits control signals to the constant current regulator 69 associated with the selected circuit, placing the regulator 69 in the charge mode at a specific current level corresponding to full-scale current (5 A in the preferred embodiment). Control signals corresponding to zero are transmitted to the regulators 69 by the microprocessor 54 for all other nonselected circuits.

Since the actual voltage level of each circuit can be accurately measured after all voltage measurement amplifiers 63 are properly calibrated using the voltage calibration process discussed above, and the resistor array 122 has a known value, the microprocessor 54 can calculate the current in each circuit. The microprocessor 54 examines the voltage output value of the analog-to-digital converter 67 for the circuit to be calibrated, and computes the amount of current (in amperes) flowing through the resistor array 122 using Ohm's law (I=V/R). The calculated current value based upon the measured voltage level for each circuit stored by the microprocessor 54 in the memory circuit associated with the charging and testing circuitry 53 as a current full-scale value. The microprocessor 54 then examines the output of the analog-to-digital converter 67 corresponding to the output signal generated by the shunt/measurement amplifier 65 for the circuit to be calibrated to determine an observed calibration current value.

Based upon these readings, the microprocessor 54 generates a charge current full-scale calibration constant and a discharge current full-scale calibration constant for each circuit. More specifically, the microprocessor 54 subtracts the charge current zero point value from the observed calibration current value for each circuit to determine the charge current fullscale value. To determine the discharge current full-scale value, the microprocessor 54 subtracts the discharge current zero point value from the observed calibration current value for each circuit. This process is repeated for all circuits associated with the system 30.

The microprocessor 54 then can convert any output signal generated by analog-to-digital converter 67 based upon measured current flow in any circuit into a calculated value representative of an actual current value (in amperes) flowing through the pin assemblies 48 using the following formulas:

When the constant current regulator 69 is in the charge mode:

Actual current value=((measured current value generated by analog-to-digital converter 67)−(charge current zero point value))(current full-scale value based upon measured voltage across the precision load 122 by the voltage pin assemblies 71)/(charge current full-scale calibration constant)

When the constant current regulator 69 is in the discharge mode:

Actual current value=((measured current value generated by analog-to-digital converter 67)−(discharge current zero point value))(current full-scale value based upon measured voltage across the precision load 122 by the voltage pin assemblies 71)/(discharge current full-scale calibration constant)

When all circuits are calibrated, a report is transmitted by the microprocessor 54 to the attached computer system 27.

The microprocessor 54 then uses the formulas, zero point values, and calibration constants described above to correct the output signals generated by analog-to-digital converter 67 during operation of each circuit. The microprocessor 54 uses this information to evaluate the operational characteristics for each circuit, and generate one or more correction factors including voltage correction factors and current correction factors for each circuit that are applied to the circuit during testing and charging operations. More specifically, when the cell trays 42 are inserted for testing and charging of the battery cells 44, the operator inputs data representative of desired current and voltage values for each cell 44 into the microprocessor 54 via the keypad 58 (FIG. 1) or other data entry system. These desired values are compared by the microprocessor 54 to measured current and voltage values for each cell 44 to evaluate the operational integrity and state of charge of each cell 44. The signal level values stored in the internal memory device associated with the charging and testing circuitry 53 for each pin assembly 48 circuit are used by the microprocessor 54 to adjust the operator-programmed values for voltage and current and the values measured by the charging and testing circuitry 53 for each battery cell 44. Adjustment of these programmed and measured values for each circuit allows for correction of testing operations performed by the microprocessor 54 to produce accurately the operator-programmed process based upon the desired current and voltage values for each cell 44. Furthermore, these adjustments provide that the data acquired by the microprocessor 54 for each battery circuit accurately represents actual conditions for each cell 44 during the charge/discharge process.

As discussed above, current and voltage measurements are received by the charging and testing circuitry 53 from the positive and negative contact plates 52 and the positive and negative electrodes of each battery cell 44 via a pair of concentric pin assemblies 48. More specifically, a first pin assembly 48 associated with the pair is operably connected to the positive electrode of a predefined cell 44 on a cell tray 42, or the positive contact plate 52 on the calibration tray 40. The second pin assembly 48 of the pair is operably connected to the negative electrode of that predefined cell 44 on the cell tray 42, or the negative contact plate 52 when the calibration tray 40 is employed. As further discussed above, the pin assemblies 48 are electrically connected to the testing circuitry 53 via connectors J and the connecting cables 38, thereby allowing for signal transmission between the batteries 44 or contact plates 52 and the testing circuitry 53. Each pin assembly 48 is designed to carry at least 5 amperes of current in the preferred embodiment. Preferably, the pin assemblies 48 are constructed from 360 brass to provide improved conductivity and ease of machining. A nickel-chrome plating preferably is used to coat each brass pin to provide corrosion resistance and surface hardness for improved durability.

Figure 9:
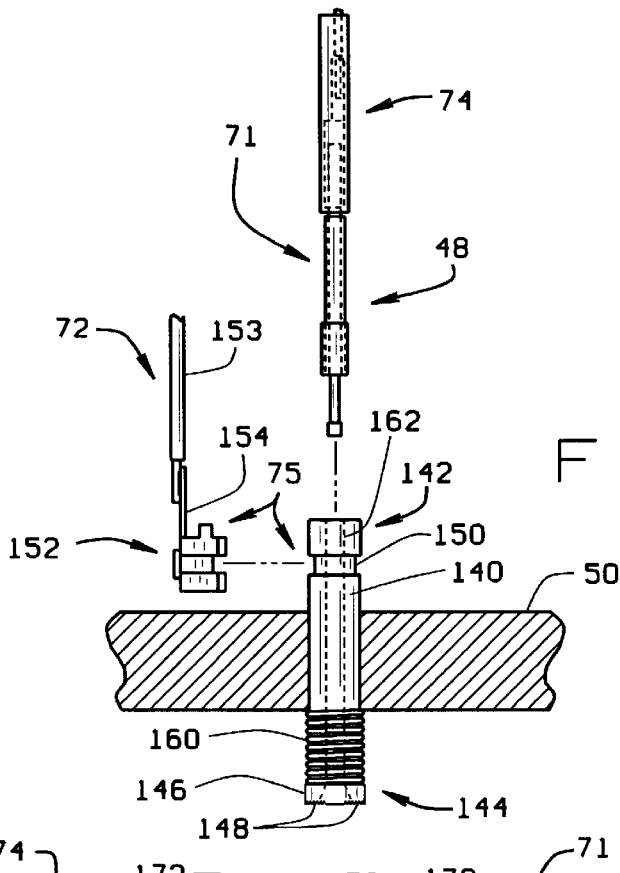
FIG. 9 is an exploded view of a pin assembly, showing the current pin, the current pin clip and lead, and the voltage sense lead.

As discussed above with respect to FIGS. 2 and 3 and further shown in FIGS. 9–12, each coaxial pin assembly 48 includes the center voltage pin assembly 71 having a voltage sense lead 74 operably connected to the battery cell 44 or contact plate 52 for voltage measurement and control, and the outer current pin assembly 75 having a current pin lead 72 operably connected to the battery cell 44 or contact plates 52 for current measurement and control. Each pin assembly 48 further includes a current pin 140 secured within an opening formed in the platen 50 when mated with current pin clip 152 (FIGS. 5 and 9). Each current pin 140 generally includes a first end portion 142 extending outwardly from the platen 50 away from the location of the cell or calibration tray 42, 40, and a second end portion 144 extending inwardly from the platen 50 toward the cell or calibration tray 42, 40. The second end portion 144 of the current pin 140 is maintained in electrical communication with one of the batteries 44 or contact plates 52 during charging, testing and calibration operations. In the preferred embodiment of the present invention, the second end portion 144 of the pin 140 has a nose 146 formed therein with a plurality of concentric grooves 148 cut into its inwardly extending face. These grooves 148 allow the nose 146 to cut through any oxide layers on a battery 44 surface which would otherwise increase contact resistance.

The first end portion 142 of the current pin 140 has a retaining clip groove 150 formed therein that acts as an electrical contact point for a current pin clip 152 associated with the pin assembly 48. The groove 150 is designed to provide mechanical retention of the current pin clip 152 to the current pin 140 such that the clip 152 can be quickly and easily snapped into engagement with or disengaged from the current pin 140. No tools are required to connect and disconnect the current pin clip 152. In the preferred embodiment, the pin clip 152 includes an solder tab that also can be used as a blade-type connection. The pin clip 152 can be purchased commercially and reshaped for the present invention using a small forming die. The pin clip 152 and current pin 140 mate easily, forming a tight connection which also allows for quick disconnection of the pin clip 152 from the current pin 140, if desired. The pin clip 152 also retains the pin assembly 48 in platen 50. Since the pin clip 152 can be easily removed, the pin assembly 48 can be easily removed from the platen 50.

Figure 12:
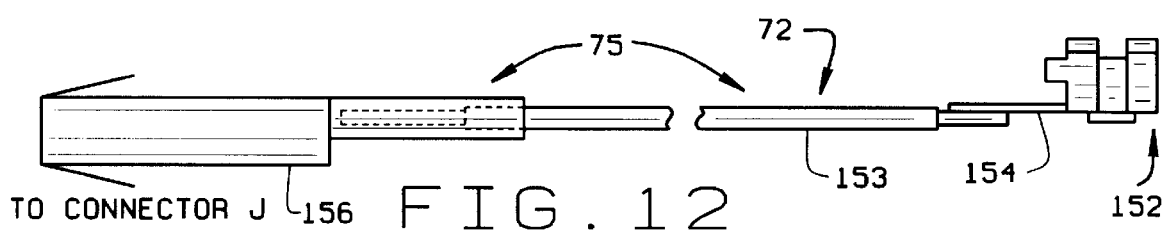
FIG. 12 shows the preferred embodiment of the current pin lead and clip shown of FIG. 9.

The current pin lead 72 includes a stranded wire 153 that is attached or soldered to an outwardly extending arm 154 of the current pin clip 152 as shown in FIG. 9. The current pin lead 72 lead provides a current path between the battery 44 or contact plate 52 and the testing circuitry 53 via the current pin 140, current pin clip 152 and connecting cable 38 when the cell or calibration tray 42, 40 is inserted into the cell rack module 34. The stranded wire 153 extends from the pin clip 152 to one end of a crimp socket 156 as shown in FIG. 12. In the preferred embodiment, the wire is 16 gauge wire, measuring 30" in length. The crimp socket 156 preferably is an 18–16 AWG tin socket sold by Bumdy Corporation, Norwalk, Conn., designed for used with a Burndy 0.062" diameter pin.

The other end of the crimp socket 156 is electrically connected to one of the connecting cables 38 via one of a plurality of connectors J. As shown in FIGS. 2 and 3 and discussed above, the cell groups associated with the preferred embodiment are operably connected to the testing circuitry 53 via connecting cables 38 and the following connectors: cells 1–8 are connected to connector J1; cells 9–16 are connected to connector J2; cells 17–24 are connected to connector J3; cells 25–32 are connected to connector J4; cells 33–40 are connected to connector J5; cells 41–48 are connected to connector J6; cells 49–56 are connected to connector J7; and cells 57–60 are connected to connector J8. As shown in FIGS. 2 and 3, each connecting cable 38 is configured such that voltage signals from the voltage sense leads 74 of the pin assemblies 48 associated with each cell grouping are transmitted through an "A" side of the connectors J (e.g., connector J1-A) at the testing circuitry 53, and current signals from the current pin leads 72 of each cell grouping are transmitted through a "B" side of the connectors J (e.g., connector J1-B) at the testing circuitry 53.

Each pin assembly 48 also includes a compression spring 160 disposed around the current pin 140 between the platen 50 and the nose 146 associated with the second end portion 144 of the current pin (FIG. 9). The springs 160 assist in positioning the current pins 140 within the openings in the platens 50 to establish electrical communication between the battery cells 44 or contact plates 52 and the current pin 140 when the pin assemblies 48 are moved into contact with the battery cells 44 or contact plates 52. This accomplishes two purposes. Contact pressure in the battery cells 44 is controlled by the pressure applied by the spring 160. The spring 160 also enables the unit to accommodate batteries having differing height without requiring reconfiguration of the unit because of such height differences.

Figure 10:
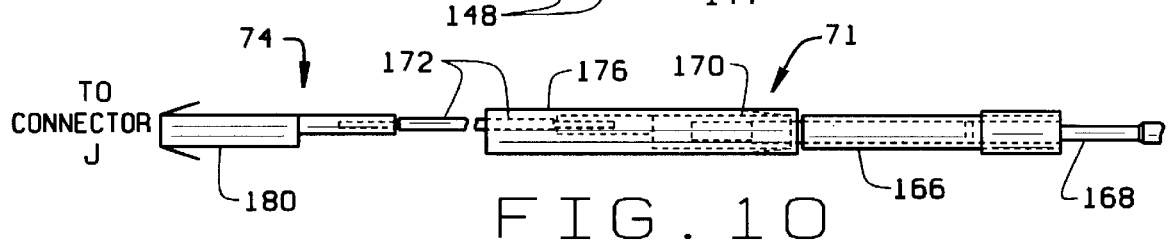
FIG. 10 shows the preferred embodiment of the voltage sense lead shown in FIG. 9.

The current pin 140 also has a substantially cylindrical opening 162 formed therein and extending axially therethrough (shown in phantom in FIG. 9) that is adapted to receive a portion of the voltage sense lead 74 assembly. More specifically, the shape of the opening 162 preferably is sized to provide a press fit for the voltage lead assembly. The voltage lead assembly 74 includes a spring pin receptacle 166 having an opening (not shown) formed in a first end of the receptacle 166. As shown in FIG. 10, a spring pin 167 is inserted into the receptacle opening such that a portion 168 of the spring pin 167 extends outwardly from the receptacle 166. As shown in FIG. 9, the circumferential dimensions of the opening 162 in the second end portion 144 of the current pin 140 are slightly greater than those for the rest of the opening 162 such that the opening 162 is gradually flared outwardly in the second end portion 144 to accommodate the outwardly extending portion of the spring pin 167.

Figure 11:
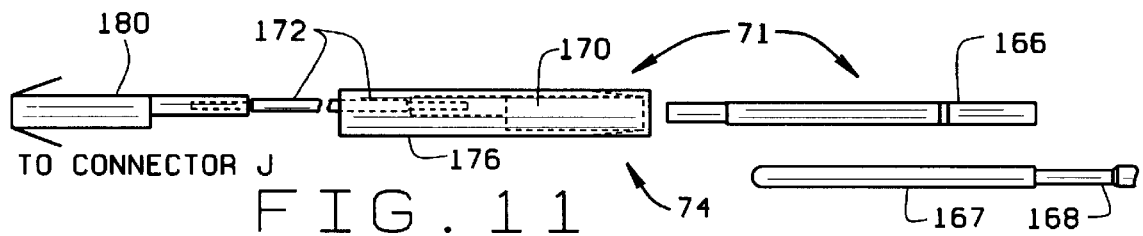
FIG. 11 is a partially exploded view of the voltage sense lead shown in FIG. 10.

The opposite end of the spring pin receptacle 166 is inserted into one end of a first crimp socket 170 as shown in FIG. 10. The crimp socket 170 used in the preferred embodiment is a 22 AWG gold socket sold by Bumdy Corporation, Norwalk, Conn., and designated as SC20M-156. The crimp socket 170 is enclosed within heatshrink tubing 176. A stranded wire 172 is inserted into the opposite end of the crimp socket 170. The wire is preferably 22 gauge wire, having an overall length of approximately 30 inches. When the receptacle 166 and wire 172 are secured within the crimp socket 170, the socket 170 and connection point of the wire 172 within the socket 170 are encased in heatshrink tubing 176 as shown in FIGS. 10 and 11.

The other end of the wire 172 is connected to one end of a second crimp socket 180. In the preferred embodiment, the second socket 180 is a 22 GAWG tin socket sold by Burndy Corporation, Norwalk, Conn., and having a model number of SC20M-1TK6. The opposite end of the crimp socket 180 is electrically connected to one of the connectors J in a similar manner as discussed above with respect to the current pin leads 72 and shown in FIGS. 2 and 3. The connectors J (e.g., connectors J1–J8 in the preferred embodiment) are electrically connected to the connecting cables 38 to establish an electrical path between the voltage sense leads 74 (and current pin leads 72) and the testing circuitry 53.

In view of the above, it will be seen that the several objects and advantages of the present invention have been achieved and other advantageous results have been obtained.

As various changes could be made in the above constructions without departing from the scope of the invention, it is intended that all matter contained in the above description or shown in the accompanying drawings shall be interpreted as illustrative and not in a limiting sense.

We claim:

1. A system for calibrating each of a plurality of electrical circuits used to charge and test a plurality of battery cells, comprising:

a memory device for storing data representative of operational characteristics for each battery cell and each electrical circuit;

charging and testing means including a data processing circuit electrically connected to said memory device for performing a sequence of operations on data stored in said memory device;

at least one calibration tray having a first electrically conductive contact plate and a second electrically conductive contact plate that is electrically insulated from the first contact plate;

means for electrically connecting said contact plates to each of said electrical circuits used to test and charge said battery cell;

calibration circuitry for generating one or more known calibration standards, said calibration circuitry being electrically connected to said contact plates and said charging and testing means, said data processing circuit actuating said calibration circuitry to alternately apply one of the calibration standards to said contact plates, said charging and testing means monitoring and evaluating operational characteristics for each electrical circuit based upon the calibration standard applied to said contact plates by said calibration circuitry, and generating one or more correction factors to be applied to each electrical circuit during charging and testing of the battery cells based upon the operational characteristics of each electrical circuit when connected to said contact plates via said electrical connecting means, said data processing circuit storing data representative of operational characteristics and correction factors for each electrical circuit in said memory device, said data processing circuit applying appropriate correction factors to each electrical circuit during subsequent testing and charging of each battery cell; and at least one cell rack module, each cell rack module being adapted to removably receive and support one of said calibration trays therein.

2. The system as set forth in claim 1 wherein said electrically connecting means includes:

at least one movable platen slidably mounted within said cell rack module, said calibration tray being disposed in close proximity to said movable platen when said calibration tray is inserted in said cell rack module, said movable platen being adapted for movement toward said calibration tray to an extended position and away from said calibration tray to a retracted position, and a plurality of electrically conductive pin assemblies mounted to said movable platen, the number of pin assemblies mounted on each platen corresponding to the number of battery cells to be charged and tested, each pin assembly having a first end portion electrically connected to said charging and testing means and extending outwardly from each platen in a direction away from said calibration tray, and a second end portion extending inwardly from each platen in a direction towards said calibration tray, said contact plates being maintained in electrical communication with the second end portions of said pin assemblies when said m ovable platen is in the extended position.

3. The system as set forth in claim 2 wherein each pin assembly further includes:

a voltage pin assembly electrically connected to said charging and testing means to allow for transmission of voltage signals between said contact plates and said charging and testing means when said movable platen is in the extended position, said voltage pin assembly providing for measurement and control of voltage signals generated across said contact plates by said data processing circuit when said platen is in the extended position, and a current pin assembly electrically connected to said charging and testing means to allow for transmission of current signals between said contact plates and said charging and testing means when said movable platen is in the extended position, said current pin assembly having an opening formed therein that is adapted to slidably receive said voltage pin assembly therethrough, said voltage pin assembly being disposed inside an electrically insulating material to electrically isolate said voltage pin assembly from said current pin assembly, said current pin assembly being removably secured within one of a plurality of openings formed in said movable platen, said current pin assembly having a first end extending inwardly from said platen toward said calibration tray, and a second end extending outwardly from said platen away from said calibration tray.

4. The system as set forth in claim 3 wherein said current pin assembly includes a collar integrally formed at the first end of said current pin assembly, a compression spring being positioned around said current pin assembly between said collar and said movable platen to limit outward movement of said current pin assembly through said opening in said movable platen.

5. The system as set forth in claim 4 wherein said current pin assembly has a groove formed in the vicinity of the second end, and further including a clip adapted for removable engagement with said groove, said clip preventing inward movement of said current pin assembly toward said calibration tray through said opening in said movable platen, said current pin assembly being slidably removable from said opening in said platen when said clip is disengaged from said current pin assembly, thereby allowing for replacement of said pin assembly when said pin assembly becomes inoperational.

6. The system as set forth in claim 2 wherein said electrically connecting means further includes:
    extension means for controlling inward movement of said movable platen toward said calibration tray, said data processing circuit triggering said extension means to move said platen into the extended position, and
    retraction means for controlling outward movement of said platen away from said calibration tray into the retracted position.

7. The system as set forth in claim 6 wherein said extension means includes at least two air cylinders mounted inside said cell rack module for controlling the inward movement of said movable platen toward said calibration tray, said air cylinders being operably connected to said data processing circuit, said data processing circuit selectively energizing said air cylinders to force said platen into the extend position during calibration, charging and testing operations.

8. The system as set forth in claim 7 wherein said retraction means includes a plurality of extension springs disposed inside the cell rack module for controlling outward movement of said platen away from said calibration tray, each extension spring having one end secured to the cell rack module and an opposite end secured to movable platen, said extension springs maintaining said movable platen in the retracted position when said air cylinders are deenergized, and returning said movable platen to said retracted position from the extended position upon deenergization of said air cylinders by said data processing circuit.

9. A system for calibrating each of a plurality of electrical circuits used to charge and test one of a plurality of battery cells, comprising:
    memory means for storing data indicative of operational characteristics associated with each battery cell and electrical circuit;
    a microprocessor electrically connected to said memory means for performing a sequence of operations on data stored in said memory means, said microprocessor further being electrically connected to said electrical circuits for controlling subsequent charging and testing of said battery cells, and controlling calibration of said electrical circuits;
    a calibration tray for calibrating said electrical circuits including a pair of oppositely charged, electrically conductive plates that are electrically isolated from each other, and further including control circuitry for applying one or more known calibration standards across said electrically conductive plates; and
    a plurality of pin assemblies for electrically connecting said electrically conductive plates to said microprocessor via said electrical circuits,
    whereby said microprocessor evaluates electrical signals transmitted by each pin assembly from said contact plates when one of said calibration standards is applied thereto to determine whether one or more correction factors should be applied to electrical signals transmitted to and from said battery cells via each electrical circuit during subsequent charging and testing of said battery cells, said microprocessor storing data representative of said correction factors in said memory means.

10. A system for calibrating each of a plurality of electrical circuits used for charging and testing a plurality of battery cells, comprising:
    a memory device for storing data representative of operational characteristics for each battery cell and each electrical circuit;
    a microprocessor electrically connected to said memory device for performing a sequence of operations on data stored in said memory device, said microprocessor further being electrically connected to said electrical circuits for controlling charging and testing of said battery cells, and controlling calibration of said electrical circuits;
    at least one calibration tray having a first electrically conductive contact plate and a second electrically conductive contact plate that is electrically insulated from the first contact plate;
    connecting means for electrically connecting said contact plates to each of said electrical circuits; and
    calibration circuitry for generating one or more known calibration standards, said calibration circuitry being electrically connected to said contact plates and said microprocessor, said microprocessor actuating said calibration circuitry to alternately apply one of the calibration standards to said contact plates, said microprocessor monitoring and evaluating operational characteristics for each electrical circuit based upon the calibration standard applied to said contact plates by said calibration circuitry, and generating one or more correction factors to be applied to each electrical circuit during subsequent charging and testing of the battery cells based upon the operational characteristics of each circuit when connected to said contact plates via said connecting means, said microprocessor storing data representative of operational characteristics and correction factors for each electrical circuit in said memory device, said microprocessor applying appropriate correction factors to each electrical circuit during subsequent testing and charging of each battery cell.

11. A system for calibrating each of a plurality of electrical circuits for charging and testing a plurality of battery cells mounted on at least one cell tray, comprising:

data processing means electrically connected to said electrical circuits for controlling calibration of said electrical circuits, controlling subsequent charging and testing of said battery cells;

a memory device electrically connected to said data processing means for storing data representative of operational characteristics for each circuit;

at least one calibration tray having a first electrically conductive contact plate and a second electrically conductive contact plate that is electrically insulated from the first conductive plate;

at least one cell rack module adapted to removably receive and support one of said calibration trays when said data processing means calibrates said electrical circuits, or one of said cell trays when said data processing means tests and charges said battery cells;

connecting assemblies for electrically connecting said electrical circuits to said calibration tray when said data processing means calibrates said electrical circuits, and to said battery cells when said data processing means tests and charges said battery cells;

calibration circuitry electrically connected to said data processing means and said contact plates for applying one or more known calibration standards across said contact plates, said data processing means monitoring and evaluating operational characteristics for each electrical circuit based upon the calibration standard applied to the contact plates, generating one or more correction factors based upon operational characteristics of each electrical circuit, and storing data representative of correction factors in said memory device, said data processing means applying appropriate correction factors to each electrical circuit during testing and charging of said battery cells.

12. A system for calibrating each of a plurality of electrical circuits for charging and testing a plurality of battery cells, comprising:

a memory device for storing data representative of operational characteristics for each battery cell and each electrical circuit;

a microprocessor electrically connected to said memory device for performing a sequence of operations on data stored in said memory device;

at least one calibration tray having a first electrically conductive contact plate and a second electrically conductive contact plate;

connecting means for electrically connecting said contact plates to each of said electrical circuits;

calibration circuitry for generating one or more known calibration standards, said calibration circuitry being electrically connected to said contact plates and said microprocessor, said microprocessor actuating said calibration circuitry to apply one of the calibration standards to said contact plates, said microprocessor monitoring and evaluating operational characteristics for each electrical circuit based upon the calibration standard applied to said contact plates by said calibration circuitry, and generating one or more correction factors to be applied to each electrical circuit during charging and testing of the battery cells based upon the operational characteristics of each electrical circuit when connected to said contact plates via said connecting means, said microprocessor storing data representative of operational characteristics and correction factors for each electrical circuit in said memory device, said microprocessor applying appropriate correction factors to each electrical circuit during subsequent testing and charging of each battery cell; and at least one cell rack module, each cell rack module being adapted to removably receive and support one of said calibration trays therein.

* * * * *